United States Patent [19]

Fukuta

[11] Patent Number: 5,030,799
[45] Date of Patent: Jul. 9, 1991

[54] PRINTED CIRCUIT BOARD

[75] Inventor: Yoshihiro Fukuta, Kanagawa, Japan

[73] Assignee: Canon Kabushiki Kaisha, Tokyo, Japan

[21] Appl. No.: 421,806

[22] Filed: Oct. 16, 1989

[30] Foreign Application Priority Data

Oct. 26, 1988 [JP] Japan .............................. 63-270375

[51] Int. Cl.⁵ .............................................. H05K 1/00
[52] U.S. Cl. ................................... 174/250; 174/259; 174/260
[58] Field of Search ........................ 174/250, 259, 260

[56] References Cited

U.S. PATENT DOCUMENTS

| 2,832,935 | 4/1958 | Tank | 174/250 X |
|---|---|---|---|
| 4,184,043 | 1/1980 | Hildering | 174/260 |
| 4,420,364 | 12/1983 | Nukii et al. | 174/259 X |
| 4,716,259 | 12/1987 | Tokura et al. | 174/25 X |
| 4,725,925 | 2/1988 | Tonaka et al. | 174/260 X |
| 4,742,431 | 5/1988 | Igarashi | 174/52.4 X |
| 4,795,079 | 1/1989 | Yamada | 174/88 R X |

Primary Examiner—Morris H. Nimmo
Attorney, Agent, or Firm—Fitzpatrick, Cella, Harper & Scinto

[57] ABSTRACT

On the printed circuit board onto which are mounted parts requiring planarization, dummy patterns which are not electrically wired are made into a shape on which the mounting parts are easily mounted, and one or several thereof are disposed in the base of the printed circuit board. In addition, a hollow portion to which an adhesive is applied is provided in the center of the dummy pattern. The above-described mounting parts are mounted on the dummy pattern, and the mounting parts are bonded by means of the adhesive applied to the hollow portion.

9 Claims, 4 Drawing Sheets

PRINTED CIRCUIT BOARD

BACKGROUND OF THE INVENTION

1. Field of the Invention

The present invention relates to a printed circuit board on which mounting parts can be made to stick with high planarization.

2. Description of the Related Art:

This kind of conventional printed circuit board has a configuration such as that shown in FIGS. 1 and 2. In these Figures, 1 is a printed circuit board, 2 is a base film of the printed circuit board 1, 3 is a copper foil pattern for electrical connection on the base film 2, 4 is a resist that functions as a protective film for the copper foil pattern 3, 5 is a sheet coil, and 6 is an adhesive for sticking the sheet coil 5 onto the printed circuit board 1. When a mounting part which requires planarization, for example, the sheet coil 5, is mounted on the printed circuit board 1, generally, it is fixed on the printed circuit board 1 as it is using the quickly-drying adhesive 6.

As described above, since the sheet coil 5, a mounting part, is stuck onto the printed circuit board 1 using the adhesive 6, there is the possibility that it may be sloped or distorted due to differences in local thickness of the adhesive 6, or that the mounting parts to be stuck onto the surface thereof such as the sheet coil 5 may be mounted further inclined by being influenced by variations in the thickness of the pattern 3 and the resist 4 on the surface of the printed circuit board 1.

For this reason, clearances between a mounting part like the sheet coil 5 and a counterpart are liable to fluctuate, causing the characteristics of the counterpart to be disturbed.

SUMMARY OF THE INVENTION

The present invention has been devised to remove the above-described disadvantages. An object of the invention is to enable mounting parts to be mounted easily and accurately onto a printed circuit board by forming a dummy pattern on the printed circuit board and by providing a hollow portion (depression portion) for applying an adhesive to the dummy pattern.

Another object of the invention is to form the dummy pattern onto a shape on which mounting parts may be easily mounted.

A further object of the invention is to adjust the fluctuations in the amount of the adhesive applied in the hollow portion of the dummy pattern.

DETAILED DESCRIPTION OF THE PREFERRED EMBODIMENTS

Figure 1:
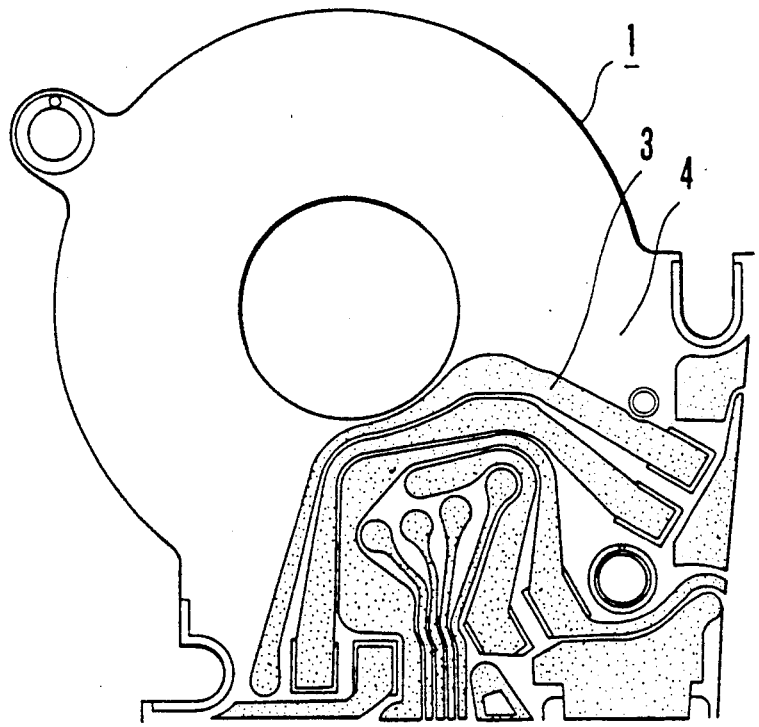
FIG. 1 is a plan view of a conventional printed circuit board.
Figure 2:
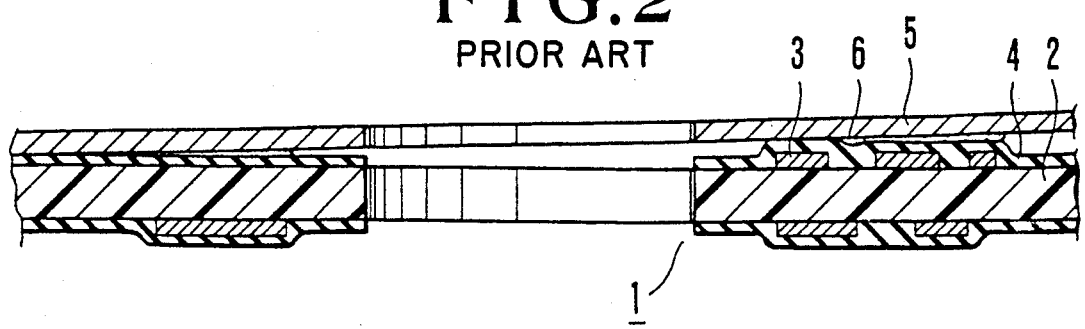
FIG. 2 is a central cross sectional view of the printed circuit board of FIG. 1, to which a sheet coil has been stuck.

The embodiments of the present invention will now be described with reference to the drawings. First, the first embodiment will be described.

In FIGS. 3 to 5, 11 is a printed circuit board, 12 is a base film of the printed circuit board 11, 13 is a copper foil pattern on the base film 12 for electrical connections, 14 is a plurality of dummy copper foil patterns on the base film 12 for the mounting parts, 15 is resist functioning as a protective film for the copper foil pattern 13 and the dummy copper foil patterns 14. 16 is a sheet coil as a mounting part, 17 is an adhesive for sticking the sheet coil 16 onto the printed circuit board 11, and 18 is a solder. Five of the plurality of dummy copper foil patterns 14, for example, are disposed in the form of a circular arc at equal spaces at equal heights. In each of the dummy copper foil patterns 14, the center part has a hollow portion (depression portion) 14a to which an adhesive is applied.

To stick the mounting parts such as the sheet coil 16 onto the printed circuit board 11, therefore, the adhesive 17 is applied to the hollow portion 14a of each of the dummy copper foil patterns 14, and the mounting parts such as the sheet coil 16 are mounted on each of the dummy copper foil patterns 14. This enables the sheet coil 16 to maintain planarization without being sloped since it is not influenced by variations in the thickness of the adhesive 17 and the heights of the dummy copper foil patterns 14 are made uniform.

Figure 6:
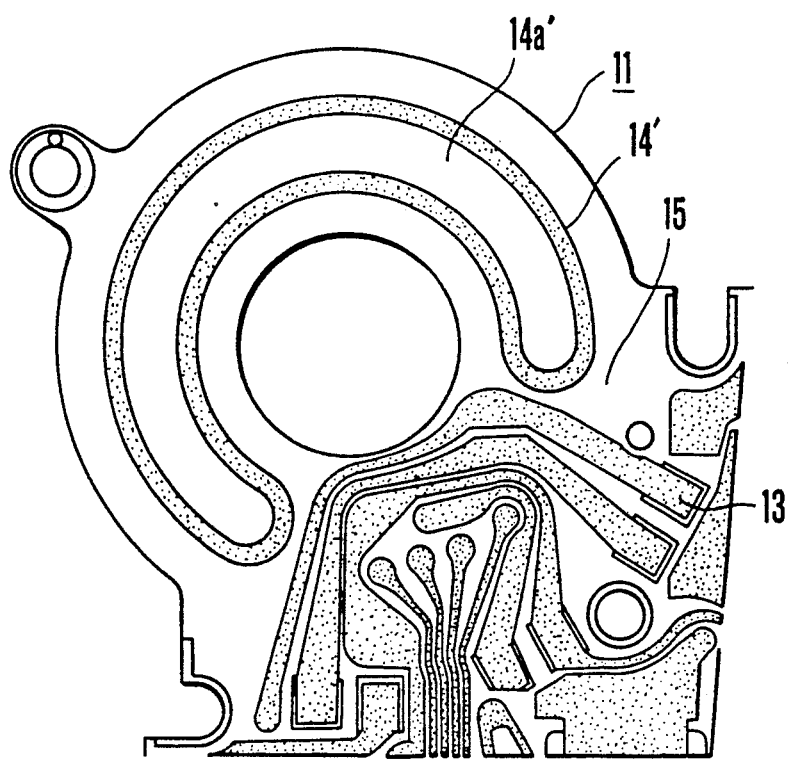
FIG. 6 is a plane view of the printed circuit board of the second embodiment of the invention.

FIG. 6 shows the second embodiment of the invention. The same parts as in FIG. 3 are given the same reference numerals, and the points that differ will be explained below.

In the example shown in FIG. 6, a dummy copper foil pattern 14' is formed into an arc so as to draw two concentric circles. Between the two concentric circles of the dummy copper foil pattern 14' is a hollow portion (depression portion) 14a' to which an adhesive is applied. An adhesive is applied to the hollow portion 14a', and the mounting parts such as a sheet coil are stuck onto the dummy copper foil pattern 14'. In this case, the hollow portion 14a', to which an adhesive is applied, is in the form of a circular arc, so that the adhesive can be applied in the form of a line, allowing more variation in the application amount.

Figure 7:
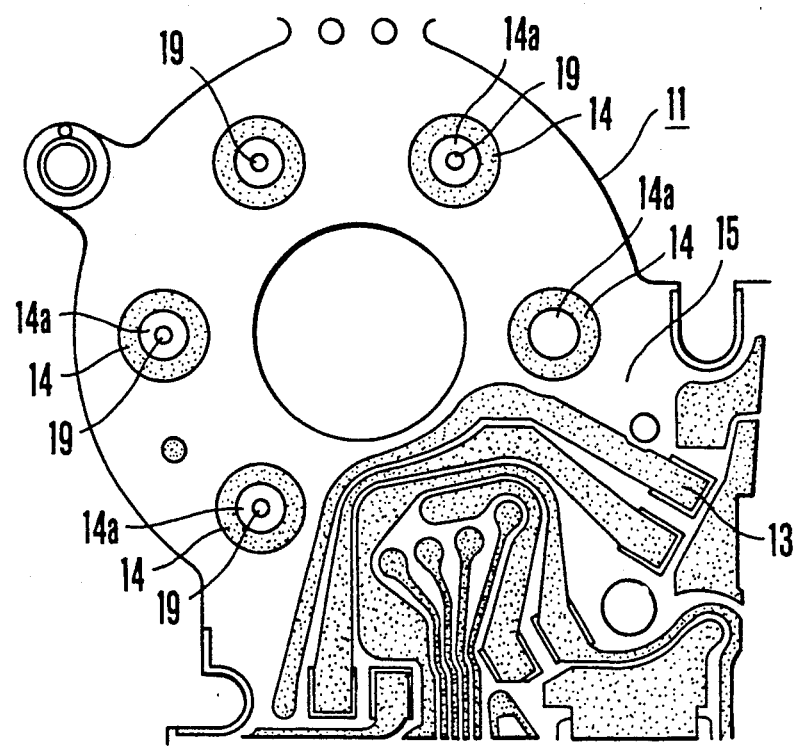
FIG. 7 is a plan view of the printed circuit board in accordance with the third embodiment of the invention.
Figure 8:
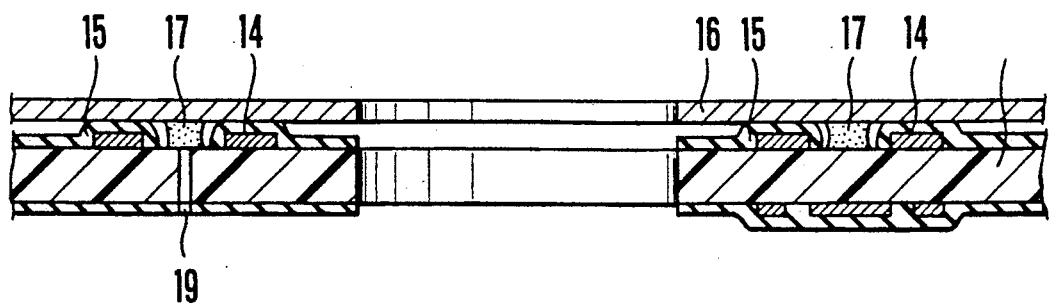
FIG. 8 is a central cross sectional view of the printed circuit board of FIG. 7.

FIGS. 7 and 8 show the third embodiment of the invention. The same parts as those in FIGS. 3 and 5 are given the same reference numerals, and the points that differ will be described below.

Figure 3:
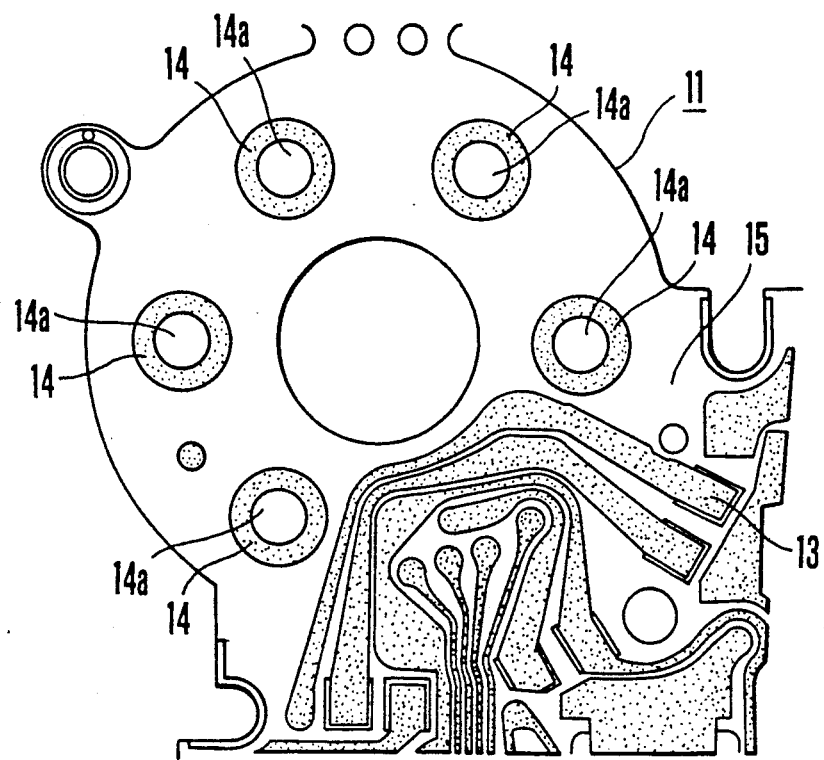
FIG. 3 is a plan view of the printed circuit board in accordance with the first embodiment of the invention.
Figure 4:
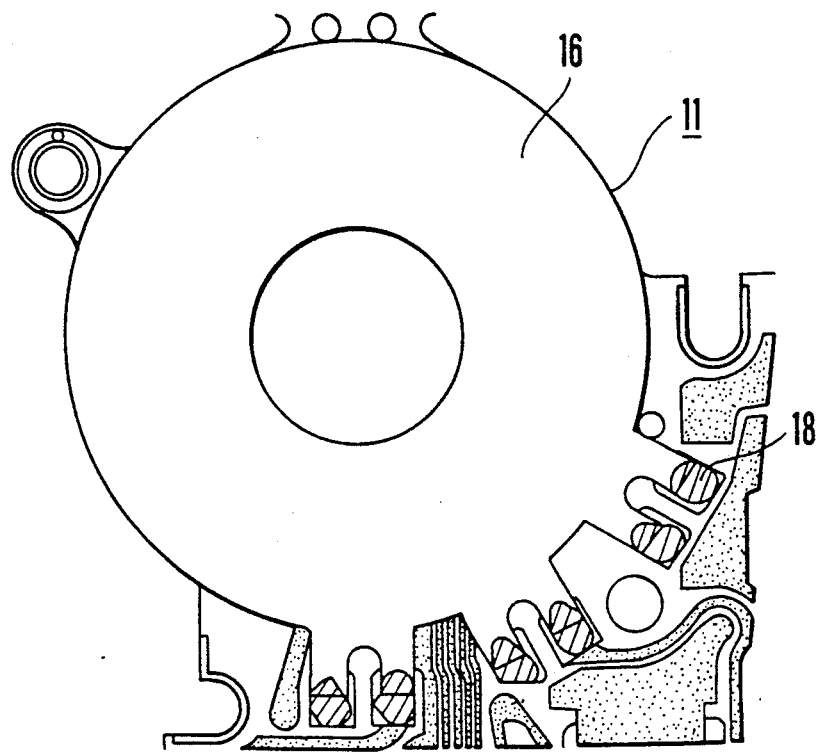
FIG. 4 is a plan view illustrating the state after a sheet coil has been stuck to the printed circuit board of FIG. 3.
Figure 5:
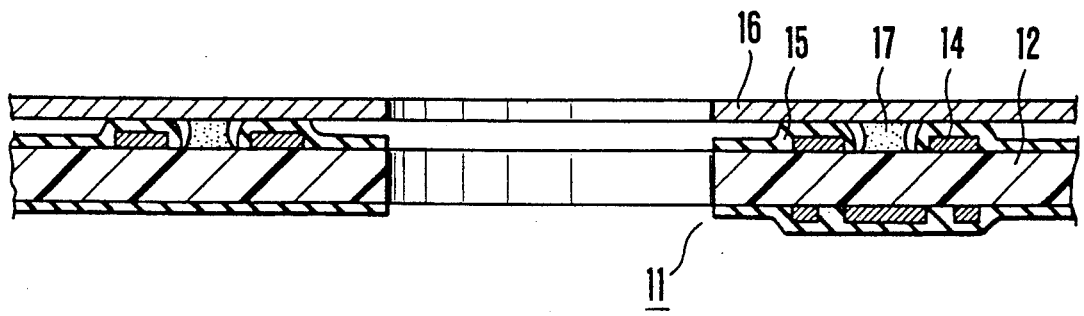
FIG. 5 is a central cross sectional view of the printed circuit board of FIG. 4.

In the examples shown in FIGS. 7 and 8, a hole 19 for discharging any excess adhesive is provided in the hollow portion 14a of the dummy copper foil patterns 14 shown in FIGS. 3 and 5. This prevents the adhesive from overflowing onto the surface, and affords control of the amount of adhesive, leading to improved workability. In a case where a copper foil pattern 13 exists on the opposite side of the hollow portion 14a, the hole 19 cannot be disposed.

In the above embodiments, the resist 15 does not exist in the hollow portion 14a or 14a'. However, if the adhesive 17 can be applied a required amount, the resist 15 can be disposed on the hollow portion 14a or 14a'. In this case, the hollow portion 14a or 14a' becomes thinner as much as the thickness of layer of the resist 15.

The resist 15 is formed by printing, but a film instead of the resist 15 may be disposed by bonding.

As set forth hereinabove, according to the present invention, the present invention has patterns formed so as to surround the positions at which an adhesive for sticking the mounting parts is applied. Therefore, the patterns can be formed equally on the surface on which the mounting parts such as a sheet coil are stuck, and the heights thereof are made equal. And fluctuations due to the thickness of the adhesive can be prevented by applying the adhesive to the surface on which no patterns exist. Furthermore, if the resist is not applied to the surface on which an adhesive is to be applied, the application surface can be made lower as much as the thickness thereof. Accordingly, the work of sticking, for example, a sheet coil, which has required a very long time in the past and needed accuracy to achieve planarization, can be done relatively easily. In addition, because of patterns that receive sheet coils, the invention has the advantage that the position of application of an adhesive can be fixed.

What is claimed is:

1. A printed circuit board to which parts requiring planarization are to be mounted using an adhesive, comprising:
   a base;
   a wiring pattern formed on the base and wired electrically;
   a dummy pattern formed on the base and not electrically wired, said dummy pattern having a same height from said base as the wiring pattern, and further having a hollow portion to which an adhesive for sticking said parts is applied; and
   a covering material covering said wiring pattern and said dummy pattern.

2. A printed circuit board according to claim 1, wherein the hollow portion of said dummy pattern is devoid of said covering material.

3. A printed circuit board according to claim 1, wherein said covering material is a resist.

4. A printed circuit board according to claim 1, wherein said dummy pattern is formed in the form of a circular arc so as to easily mount said parts to be mounted.

5. A printed circuit board to which parts requiring planarization are to be mounted using an adhesive, comprising:
   a base;
   a wiring pattern formed on the base and wired electrically;
   a plurality of dummy patterns formed on the base and not electrically wired, said plurality of dummy patterns being arrayed and each having a same height from said base as the wiring pattern, and further having a hollow portion to which an adhesive for sticking said parts is applied; and
   a covering material covering said wiring pattern and said plurality of dummy patterns.

6. A printed circuit board according to claim 5, wherein a through hole for allowing an adhesive to escape is disposed in a part of the hollow portion of said dummy pattern.

7. A printed circuit board according to claim 5, wherein heights of said plurality of dummy patterns covered with said covering material are made uniform.

8. A printed circuit board comprising:
   a base;
   a wiring pattern formed on the base and wired electrically;
   a dummy pattern formed on the base and not electrically wired, said dummy pattern having a same height from said base as the wiring pattern, and further having a hollow portion to which an adhesive is applied;
   a covering material covering said wiring pattern and said dummy pattern; and
   mounting parts requiring planarization, said mounting parts being mounted on said covering material covering said dummy pattern, and being bonded by the adhesive applied to said hollow portion.

9. A printed circuit board to which parts are to be mounted using an adhesive, comprising:
   a base;
   a pattern formed on the base and having a uniform height from said base, said pattern being formed in the form of an arc so as to easily mount said parts to be mounted, and having a hollow portion to which an adhesive is applied; and
   a covering material covering said pattern.

* * * * *